United States Patent
Hirabayashi

(10) Patent No.: US 12,374,407 B2
(45) Date of Patent: Jul. 29, 2025

(54) SENSE TIMING GENERATION CIRCUIT AND SEMICONDUCTOR MEMORY DEVICE

(71) Applicants: Kabushiki Kaisha Toshiba, Tokyo (JP); Toshiba Electronic Devices & Storage Corporation, Tokyo (JP)

(72) Inventor: Osamu Hirabayashi, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 188 days.

(21) Appl. No.: 17/903,538

(22) Filed: Sep. 6, 2022

(65) Prior Publication Data

US 2023/0326534 A1    Oct. 12, 2023

(30) Foreign Application Priority Data

Mar. 24, 2022  (JP) .................... 2022-048991

(51) Int. Cl.
G11C 16/32    (2006.01)
G11C 16/26    (2006.01)

(52) U.S. Cl.
CPC ............ *G11C 16/32* (2013.01); *G11C 16/26* (2013.01)

(58) Field of Classification Search
CPC ........... G11C 16/32; G11C 16/26; G11C 7/04; G11C 7/06; G11C 7/062; G11C 7/067; G11C 7/08; G11C 7/22
USPC ................................................ 365/207, 194
See application file for complete search history.

(56) References Cited

U.S. PATENT DOCUMENTS

| | | | |
|---|---|---|---|
| 5,081,380 A | 1/1992 | Chen | |
| 5,267,203 A * | 11/1993 | Hwang | ............... G11C 11/4091 |
| | | | 365/230.06 |
| 6,163,195 A | 12/2000 | Jefferson | |
| 6,282,133 B1 | 8/2001 | Nakagawa | |
| 7,450,446 B2 | 11/2008 | Noda | |
| 7,733,711 B2 | 6/2010 | Burnett | |
| 8,300,484 B2 | 10/2012 | Yoshida | |

(Continued)

FOREIGN PATENT DOCUMENTS

| | | |
|---|---|---|
| JP | H03-171812 A | 7/1991 |
| JP | H10-322178 A | 12/1998 |

(Continued)

OTHER PUBLICATIONS

Decision to Grant a Patent mailed on Mar. 4, 2025 in the corresponding Japanese Patent Application No. 2022-048991 with English translation, 4 pages.

*Primary Examiner* — Connie C Yoha
(74) *Attorney, Agent, or Firm* — Kim & Stewart LLP

(57) ABSTRACT

A sense timing generation circuit of an embodiment is a sense timing generation circuit that outputs, from an output terminal, a sense amplifier enable signal for bringing a sense amplifier into an enable state, based on a clock signal input from an input terminal, and includes a delay circuit unit that has a temperature characteristics by which a delay amount decreases in accordance with a temperature rise, includes a plurality of types of a plurality of delay circuits being different in the temperature characteristics, and delays the clock signal and outputs the clock signal as the sense amplifier enable signal, and a connection switch unit that switches a connection state of a plurality of delay circuits in the delay circuit unit from the input terminal to the output terminal.

9 Claims, 5 Drawing Sheets

(56) References Cited

U.S. PATENT DOCUMENTS

| | | |
|---|---|---|
| 8,605,524 B2 | 12/2013 | Yoshida |
| 2003/0112046 A1 | 6/2003 | Atallah |
| 2005/0135430 A1* | 6/2005 | Le .............................. G11C 7/22 |
| | | 370/537 |
| 2007/0121394 A1 | 5/2007 | Noda |
| 2007/0165474 A1 | 7/2007 | Kim |
| 2009/0129155 A1 | 5/2009 | Honda et al. |
| 2010/0061162 A1 | 3/2010 | Burnett |
| 2010/0195414 A1* | 8/2010 | Kim ................. G01R 19/16552 |
| | | 365/207 |
| 2011/0055465 A1 | 3/2011 | Honda et al. |
| 2011/0149663 A1 | 6/2011 | Yoshida |
| 2012/0155169 A1 | 6/2012 | Honda et al. |
| 2013/0039136 A1 | 2/2013 | Yoshida |
| 2014/0063992 A1 | 3/2014 | Yoshida |
| 2020/0204164 A1* | 6/2020 | Nishiyama ....... H03K 19/00384 |
| 2022/0283549 A1* | 9/2022 | Zhao ........................ G04F 10/06 |
| 2023/0378948 A1* | 11/2023 | Yang ...................... H03K 19/21 |

FOREIGN PATENT DOCUMENTS

| | | |
|---|---|---|
| JP | 2001-084775 A | 3/2001 |
| JP | 2006-230003 A | 8/2006 |
| JP | 2007-141383 A | 6/2007 |
| JP | 2010-055673 A | 3/2010 |
| JP | 2011-129237 A | 6/2011 |
| JP | 2012-502400 A | 1/2012 |

\* cited by examiner

US 12,374,407 B2

SENSE TIMING GENERATION CIRCUIT AND SEMICONDUCTOR MEMORY DEVICE

CROSS-REFERENCE TO RELATED APPLICATIONS

This application is based upon and claims the benefit of priority from Japanese Application No. 2022-048991, filed on Mar. 24, 2022, the entire contents of which are incorporated herein by reference.

FIELD

Embodiments described herein relate generally to a sense timing generation circuit and a semiconductor memory device.

BACKGROUND

In a semiconductor memory device, a sense amplifier is activated after a potential of a bit line becomes a potential sufficient for determining an output of the sense amplifier at the time of data readout. At this time, a timing at which the sense amplifier is activated (hereinafter, will be referred to as a sense timing) is set in such a manner that a characteristic variation of a transistor used in the sense amplifier is absorbed, and a level of a readout signal can be surely determined.

On the other hand, a change in potential of a readout signal varies depending on temperature such as ambient temperature. If a timing at which a sense amplifier is activated (hereinafter, sense timing) is assumed to remain the same, in a case where a value of a memory cell is "0", a readout margin (difference between the level of a readout signal and the level of a reference signal for determination) becomes smaller as temperature gets higher, and in a case where a value of a memory cell is "1", a data readout margin becomes smaller as temperature gets lower.

One embodiment of the present invention aims to provide a sense timing generation circuit and a semiconductor memory device that can generate a sense timing that enables an operation with high reliability to be performed by reducing the influence caused by temperature and increasing a readout margin.

DETAILED DESCRIPTION

An exemplary embodiment of a semiconductor memory device will be explained below in detail with reference to the accompanying drawings.

In addition, the present invention is not limited to these embodiments.

A sense timing generation circuit of an embodiment is a sense timing generation circuit that outputs, from an output terminal, a sense amplifier enable signal for bringing a sense amplifier into an enable state, based on a clock signal input from an input terminal, and includes a delay circuit unit that has a temperature characteristics by which a delay amount decreases in accordance with a temperature rise, includes a plurality of types of a plurality of delay circuits being different in the temperature characteristics, and delays the clock signal and outputs the clock signal as the sense amplifier enable signal, and a connection switch unit that switches a connection state of a plurality of delay circuits in the delay circuit unit from the input terminal to the output terminal.

Next, as an example of a semiconductor device, a NOR-type flash memory will be described in detail.

Figure 1:
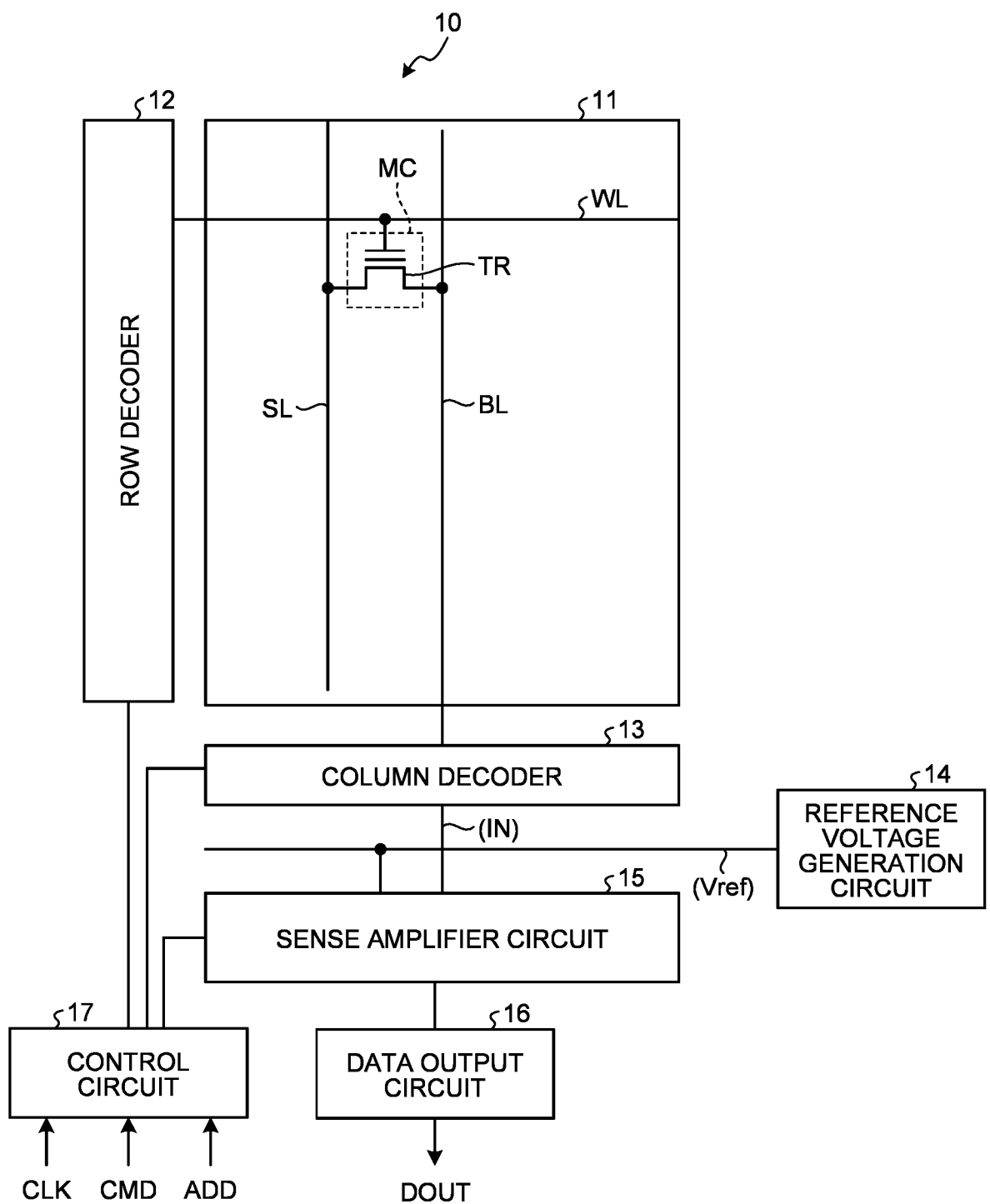
FIG. 1 is an explanatory diagram of a schematic configuration of a semiconductor memory device according to an embodiment.

FIG. 1 is an explanatory diagram of a schematic configuration of a semiconductor memory device according to an embodiment.

A semiconductor device 10 is formed as a NOR-type flash memory, and includes a memory cell array 11, a row decoder 12, a column decoder 13, a reference voltage generation circuit 14, a sense amplifier circuit 15, a data output circuit 16, and a control circuit 17 as illustrated in FIG. 1.

The memory cell array 11 includes a plurality of memory cells MC arranged in a grid.

In addition, the memory cell array includes a plurality of word lines WL, a plurality of source lines SL, and a plurality of bit lines BL.

For ease of understanding, FIG. 1 only displays only one memory cell MC in a selected state, and displays only a word line WL, a source line SL, and a bit line BL that correspond to the memory cell MC.

Here, the memory cell MC includes a memory cell transistor TR having a source terminal connected to the source line SL, a gate terminal connected to the word line WL, and a drain terminal connected to the bit line BL.

Under the control of the control circuit 17, the row decoder 12 brings the word line WL corresponding to the readout target memory cell MC, into an enable state.

Under the control of the control circuit 17, the column decoder 13 brings the source line SL and the bit line BL that correspond to the readout target memory cell MC, into the enable state.

The reference voltage generation circuit 14 generates a reference voltage and supplies the reference voltage to the sense amplifier circuit 15.

The sense amplifier circuit 15 determines data of the memory cell MC by comparing the potential of the bit line corresponding to the memory cell MC being in the selected state at a predetermined timing, with the reference voltage, and outputs a determination result to the data output circuit 16.

The data output circuit 16 outputs readout data DOUT based on the output of the sense amplifier circuit 15.

Based on a clock signal CLK, command data CMD, and address data ADD from a host device (e.g., micro processing unit (MPU)) (not illustrated), the control circuit 17 controls the row decoder 12, the column decoder 13, and the sense amplifier circuit 15 to write data into, read out data from, or delete data from the corresponding memory cell MC.

Figure 2:
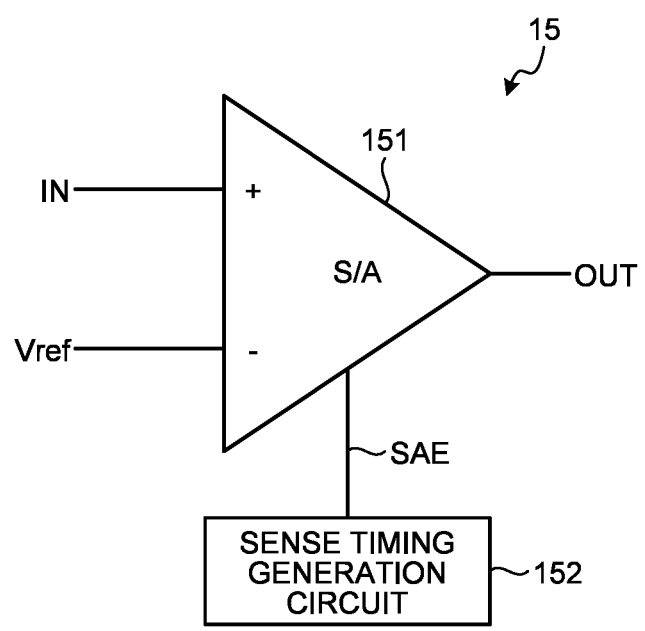
FIG. 2 is an explanatory diagram of a main portion configuration example of a sense amplifier circuit.

FIG. 2 is an explanatory diagram of a main portion configuration example of a sense amplifier circuit.

Next, the configuration of the sense amplifier circuit 15 will be described.

The sense amplifier circuit 15 includes a plurality of sense amplifiers 151 and a plurality of sense timing generation circuits 152 that correspond to the respective bit lines BL.

In this case, the sense timing generation circuit 152 can be shared by a plurality of sense amplifiers 151.

An input signal IN from the source line SL of each block BLK is input to a non-inverting input terminal of the sense amplifier 151, and a reference voltage Vref is input to an inverting input terminal of the sense amplifier 151. In a case where a sense amplifier enable signal SAB from the sense timing generation circuit 152 is in an enable state, in a case where the input signal IN is a voltage equal to or higher than the reference voltage Vref, the sense amplifier 151 outputs an output signal OUT at an "H" level.

In addition, in a case where the sense amplifier enable signal SAE from the sense timing generation circuit 152 is in the enable state, in a case where the input signal IN is a voltage smaller than the reference voltage Vref, the sense amplifier 151 outputs the output signal OUT at an "L" level.

Here, a configuration example of the sense timing generation circuit 152 will be described.

Figure 3:
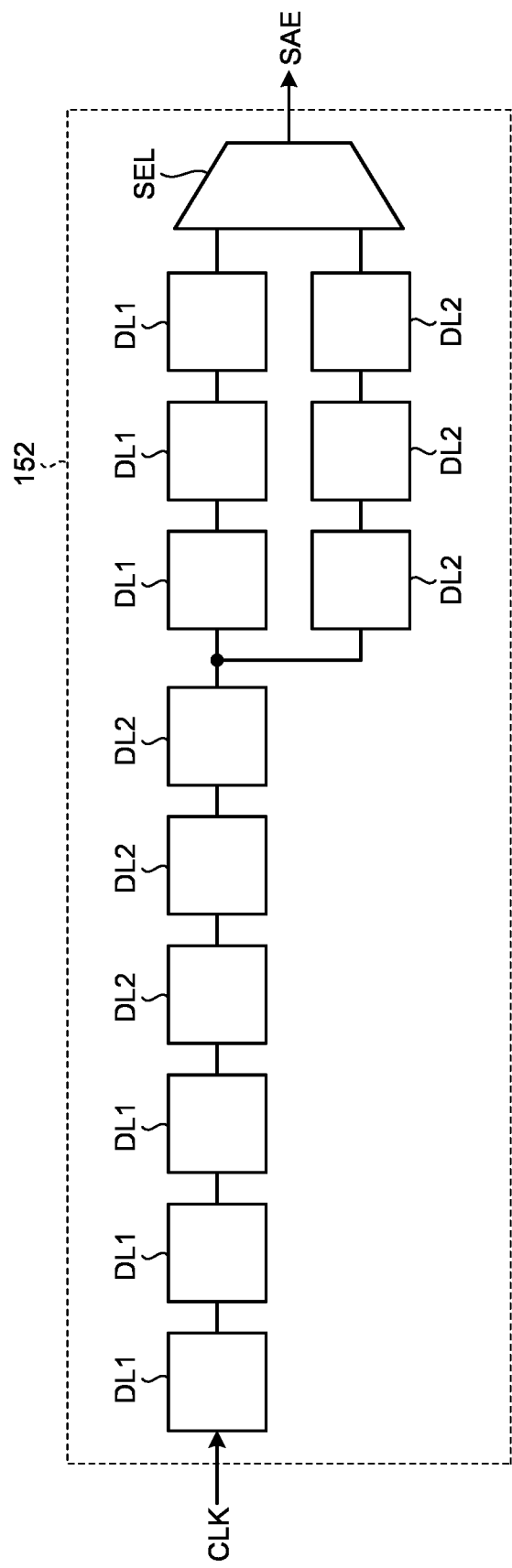
FIG. 3 is an explanatory diagram of an example of a sense timing generation circuit.

FIG. 3 is an explanatory diagram of an example of a sense timing generation circuit.

The sense timing generation circuit 152 includes a plurality of (six in the example illustrated in FIG. 3) first delay circuits DL1, a plurality of (six in the example illustrated in FIG. 3) second delay circuits DL2, and a selector SEL.

Here, the first delay circuits DL1 and the second delay circuits DL2 differ in temperature characteristics and delay time as described in detail later.

Series-connected three first delay circuits DL1 to which the clock signal CLK is input are provided in the sense timing generation circuit 152 (more specifically, at an input end).

Three second delay circuits DL2 are provided posterior to the three first delay circuits DL1.

These six delay circuits function as a series connection unit in which a plurality of delay circuits is connected in series.

Furthermore, posterior to the three second delay circuits DL2, series-connected three first delay circuits DL1 and series-connected three second delay circuits DL2 are connected in parallel.

These six delay circuits are connected to the series unit, and the delay circuits function as a parallel connection unit in which a plurality of systems (two systems in the example illustrated in FIG. 3) are connected.

Then, posterior to the parallel connection unit, the selector SEL functioning as a connection switch unit is connected. The systems are connected to the respective input terminals of the selector SEL, and the selector SEL outputs an input signal of any one input terminal as the sense amplifier enable signal SAE.

In the above description, the selector SEL functioning as a connection switch unit is connected posterior to the parallel connection unit. Alternatively, the respective output ends of the systems of the parallel connection unit can be connected in common, and the selector SEL functioning as a connection switch unit can be provided between the series connection unit and the parallel connection unit.

Alternatively, a configuration in which the connection switch unit is connected posterior to the parallel connection unit, and the series connection unit is further connected posterior to the connection switch unit can also be employed.

Here, configuration examples of the first delay circuit DL1 and the second delay circuit DL2 will be described in detail.

Figure 4A:
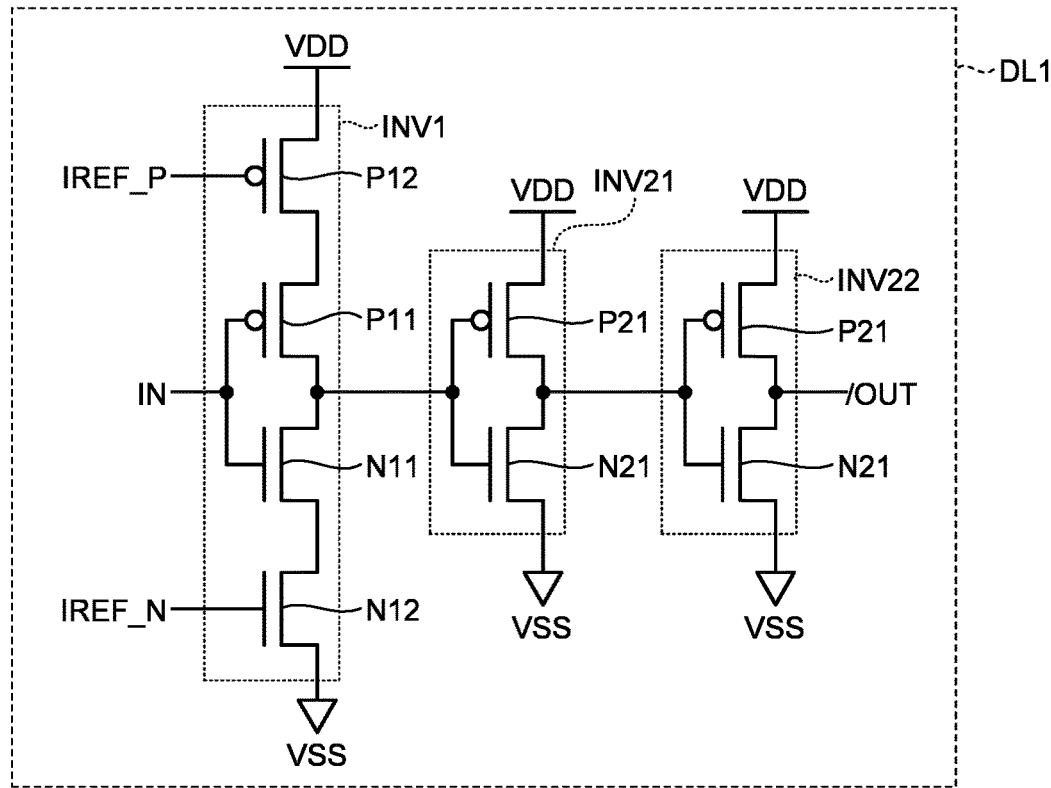
FIGS. 4A and 4B are explanatory diagrams of configuration examples of delay circuits.
Figure 4B:
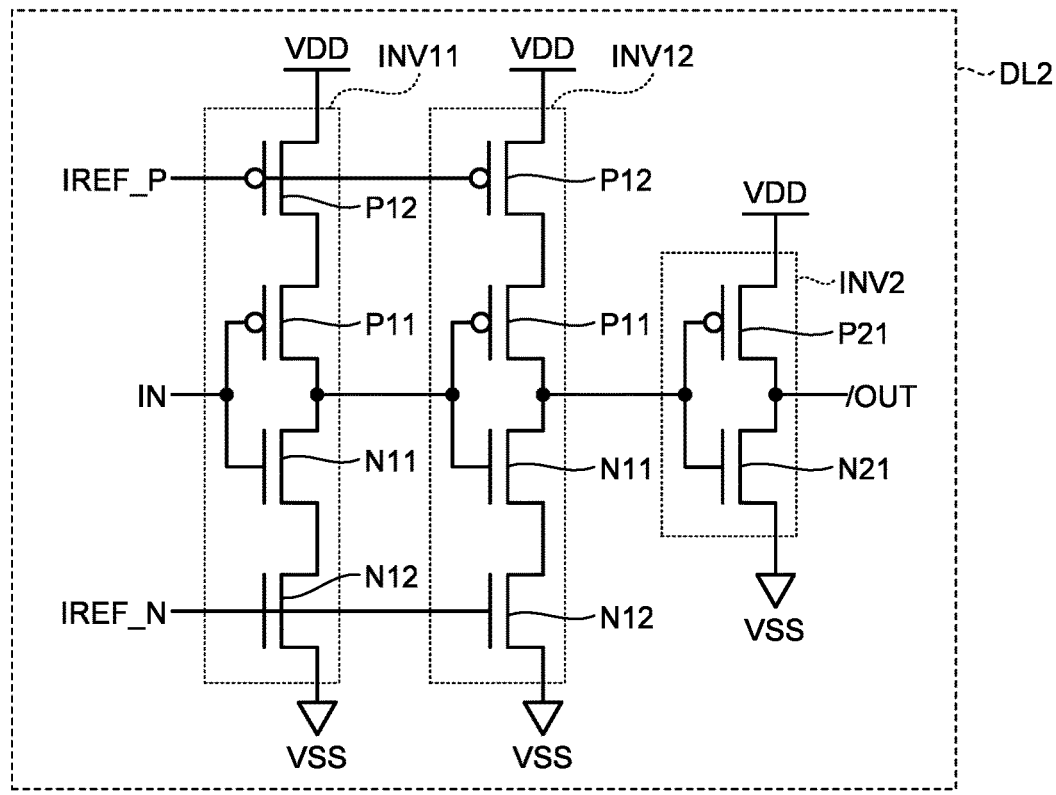

FIGS. 4A and 4B are explanatory diagrams of configuration examples of delay circuits.

FIG. 4A is an explanatory diagram of an example of a circuit configuration of the first delay circuit DL1.

FIG. 4B is an explanatory diagram of an example of a circuit configuration of the second delay circuit DL2.

In the drawings, similar parts are assigned the same reference numeral.

As illustrated in FIG. 4A, the first delay circuit DL1 broadly includes a first inverter INV1 that can adjust drive force, and has a negative temperature coefficient (negative temperature characteristics), a second inverter INV21 that has an input terminal connected to an output terminal of the first inverter INV1, and has a positive temperature coefficient (positive temperature characteristics), and a second inverter INV22 that has an input terminal connected to an output terminal of the second inverter INV21, and has a positive temperature coefficient (positive temperature characteristics).

In this case, the positive temperature characteristics means that a delay time becomes longer as temperature gets higher, and the negative temperature characteristics means that a delay time becomes longer as temperature gets lower.

In addition, the second inverter INV21 and the second inverter INV22 have the same configuration and the same temperature characteristics.

The first inverter INV1 includes a P-channel metal-oxide semiconductor (MOS) transistor P11 having a gate terminal connected to an input terminal of the first delay circuit D11, and a drain terminal connected to the output terminal of the first inverter INV1, and a P-channel MOS transistor P12 having a drain terminal connected to a source terminal of the P-channel MOS transistor P11, a gate terminal to which a drive force control signal IREF_P is input, and a source terminal connected to a high potential side power source VDD.

The first inverter INV1 further includes an N-channel MOS transistor N11 having a gate terminal connected to the input terminal of the first delay circuit DL1, and a drain terminal connected to the output terminal of the first inverter INV1, and an N-channel MOS transistor N12 having a drain terminal connected to a source terminal of the N-channel MOS transistor N11, a gate terminal to which a drive force control signal IREF_N is input, and a source terminal connected to a low potential side power source VSS.

The second inverter INV21 includes a P-channel MOS transistor P21 having a gate terminal connected to the output terminal of the first inverter INV1, a source terminal connected to a high potential side power source VDD, and a drain terminal connected to the output terminal of the second inverter INV21, and an N-channel MOS transistor N21 having a gate terminal connected to the output terminal of the first inverter INV1, a drain terminal connected to the output terminal of the second inverter INV21, and a source terminal connected to a low potential side power source VSS.

Similarly, the second inverter INV22 includes a P-channel MOS transistor P21 having a gate terminal connected to the output terminal of the second inverter INV21, a source terminal connected to a high potential side power source VDD, and a drain terminal connected to an output terminal of the first delay circuit DL1, and an N-channel MOS transistor N21 having a gate terminal connected to the output terminal of the second inverter INV21, a drain terminal connected to the output terminal of the first delay circuit D11, and a source terminal connected to a low potential side power source VSS.

As illustrated in FIG. 4B, the second delay circuit DL2 broadly includes a first inverter INV11 that can adjust drive force, and has a negative temperature coefficient (negative temperature characteristics), a first inverter INV12 that has an input terminal connected to an output terminal of the first inverter INV12, can adjust drive force, and has a negative temperature coefficient (negative temperature characteristics), and a second inverter INV2 that has an input terminal connected to the output terminal of the first inverter INV12, and has a positive temperature coefficient (positive temperature characteristics).

In this case, the first inverter INV11 and the first inverter INV12 have the same configuration and the same temperature characteristics.

The first inverter INV11 includes a P-channel MOS transistor P11 having a gate terminal connected to an input terminal of the second delay circuit DL2, and a drain terminal connected to an output terminal of the first inverter INV11, and a P-channel MOS transistor P12 having a drain terminal connected to a source terminal of the P-channel MOS transistor P11, a gate terminal to which a drive force control signal IREF_P is input, and a source terminal connected to a high potential side power source VDD.

The first inverter INV11 further includes an N-channel MOS transistor N11 having a gate terminal connected to the input terminal of the second delay circuit DL2, and a drain terminal connected to the output terminal of the first inverter INV11, and an N-channel MOS transistor N12 having a drain terminal connected to a source terminal of the N-channel MOS transistor N11, a gate terminal to which a drive force control signal IREF_N is input, and a source terminal connected to a low potential side power source VSS.

The first inverter INV12 includes a P-channel MOS transistor P11 having a gate terminal connected to the output terminal of the first inverter INV11, and a drain terminal connected to the output terminal of the first inverter INV12, and a P-channel MOS transistor P12 having a drain terminal connected to a source terminal of the P-channel MOS transistor P11, a gate terminal to which a drive force control signal IREF_P is input, and a source terminal connected to a high potential side power source VDD.

The first inverter INV12 further includes an N-channel MOS transistor N11 having a gate terminal connected to the output terminal of the first inverter INV11, and a drain terminal connected to the output terminal of the first inverter INV12, and an N-channel MOS transistor N12 having a drain terminal connected to a source terminal of the N-channel MOS transistor N11, a gate terminal to which a drive force control signal IREF_N is input, and a source terminal connected to a low potential side power source VSS.

The second inverter INV2 includes a P-channel MOS transistor P21 having a gate terminal connected to the output terminal of the first inverter INV12, a source terminal connected to a high potential side power source VDD, and a drain terminal connected to an output terminal of the second delay circuit DL2, and an N-channel MOS transistor N21 having a gate terminal connected to the output terminal of the first inverter INV12, a drain terminal connected to the output terminal of the second delay circuit DL2, and a source terminal connected to a low potential side power source VSS.

In the present embodiment, the first delay circuit DL1 and the second delay circuit DL2 are both delay circuits having negative temperature coefficients, but the second delay circuit DL2 is a delay circuit having a larger negative temperature coefficient than that of the first delay circuit DL1.

That is, when a temperature coefficient of the first delay circuit DL1 is denoted by P1, and a temperature coefficient of the second delay circuit DL2 is denoted by P2, $$0 > P1 > P2$$

is satisfied.

In other words, in a case where temperature increases by a constant amount, a decrease in delay amount of the first delay circuit DL1 becomes smaller than a decrease in delay amount of the second delay circuit DL2.

Accordingly, in a case where a larger number of the second delay circuits DL2 are used as delay circuits included in the sense timing generation circuit 152, as compared with a case where a larger number of the first delay circuits DL1 are used, a decrease in delay amount becomes larger with respect to a temperature rise. That is, a state shifts to a sense amplifier enable state earlier.

The above description has been given of a case where the first inverters INV1, INV11, and INV12 have negative temperature coefficients (negative temperature characteristics), and the second inverters INV2, INV21, and INV22 have positive temperature coefficients (positive temperature characteristics), but these positive and negative coefficients may be reverse.

In this case, the temperature characteristics of the first delay circuit DL1 and the temperature characteristics of the second delay circuit DL2 naturally become reverse states.

In addition, the description has been given of a case Where the temperature characteristics of the first delay circuit DL1 and the temperature characteristics of the second delay circuit DL2 are both negative, but a temperature characteristics of any of the first delay circuits DL1 may be a positive temperature characteristics.

Next, an operation of an embodiment will be described.

First of all, precedential to the description of an operation of an embodiment, a conventional problematic point will be described.

Figure 5:
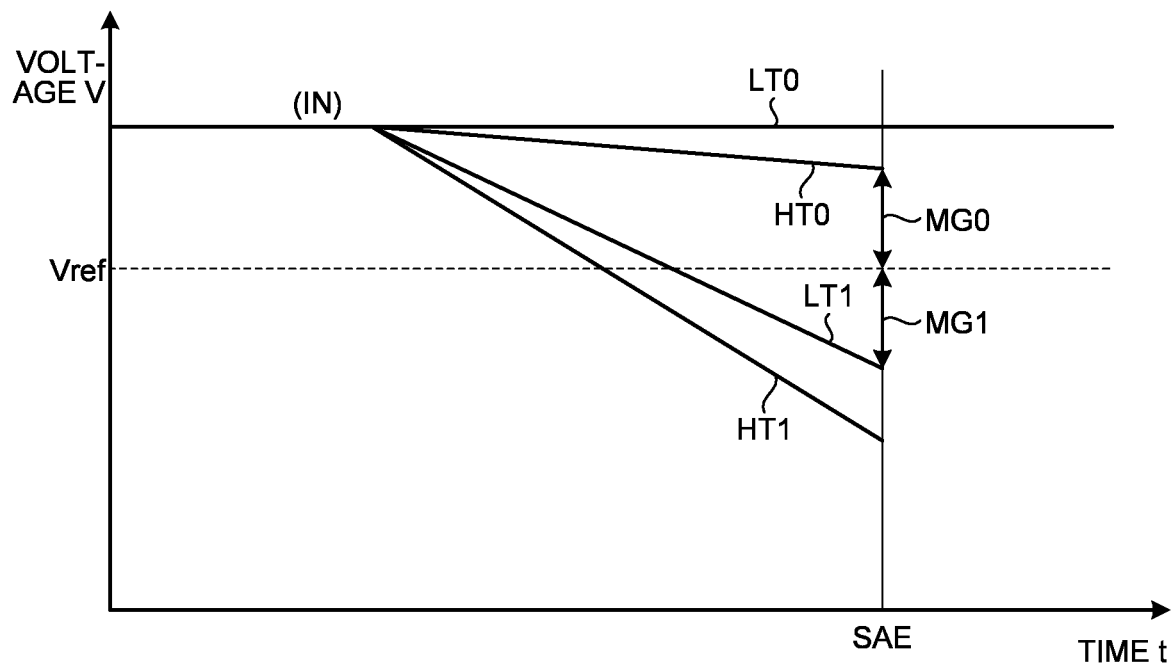
FIG. 5 is an explanatory diagram of a conventional problematic point.

FIG. 5 is an explanatory diagram of a conventional problematic point.

An output timing of a sense amplifier enable signal from a conventional sense timing generation circuit has been fixed.

On the other hand, in a case where readout is performed from a flash memory covering a wide temperature range (e.g., −40 to 175° C.), a fluctuation state of a readout voltage varies depending on a value stored in a memory cell and temperature.

More specifically, in a case where a threshold voltage Vth of the memory cell transistor TR included in the memory cell MC is in a high state, even if the word line WL enters the "H" level, the memory cell transistor TR remains in an off state, and the potential of the bit line BL remains at almost a power source potential.

Nevertheless, due to leak current of the memory cell transistor TR, the potential of the bit line BL gradually declines only slightly.

Generally, the leak current of the memory cell transistor TR tends to increase as temperature gets higher. Thus, as temperature gets higher, a decline in potential of the bit line BL that is obtained in a case where a value stored in the memory cell MC=0 is read out becomes faster as illustrated in FIG. 5.

Accordingly, as an operation temperature range gets higher, a data readout margin MG0 with respect to the reference voltage Vref might become insufficient, and read data might become an error.

On the other hand, in a case where the threshold voltage Vth of the memory cell transistor TR included in the memory cell MC configuration is in a low state, if the word line WL becomes a high level, the memory cell transistor TR enters an on state, on current flows from the bit line BL to the source line SL, and the potential of the bit line BL gradually declines.

Generally, because the on current of the memory cell transistor TR tends to decrease as temperature gets lower, as temperature gets lower, a decline in potential of the bit line BL that is obtained in a case where a value stored in the memory cell MC=1 is read out becomes slower as illustrated in FIG. 5.

Accordingly, as an operation temperature range gets lower, a data readout margin MG1 with respect to the reference voltage Vref might become insufficient, and read data might become an error.

Next, an operation of an embodiment will be described again with reference to FIG. 3.

In the sense timing generation circuit 152, the selector SEL is configured to preliminarily select either the three series-connected first delay circuits DL1 included in the parallel connection unit, or the three series-connected second delay circuits DL2 included in the parallel connection unit.

Accordingly, in a case where the selector SEL preliminarily selects the three series-connected first delay circuits DL1 on the upper row that are included in the parallel connection unit, the sense timing generation circuit 152 has a configuration in which the six first delay circuits DL1 and the three second delay circuits DL2 are substantively connected in series.

In a case where the selector SEL preliminarily selects the three series-connected second delay circuits DL2 on the lower row that are included in the parallel connection unit, the sense timing generation circuit 152 has a configuration in which the three first delay circuits DL1 and the six second delay circuits DL2 are substantively connected in series.

Figure 6:
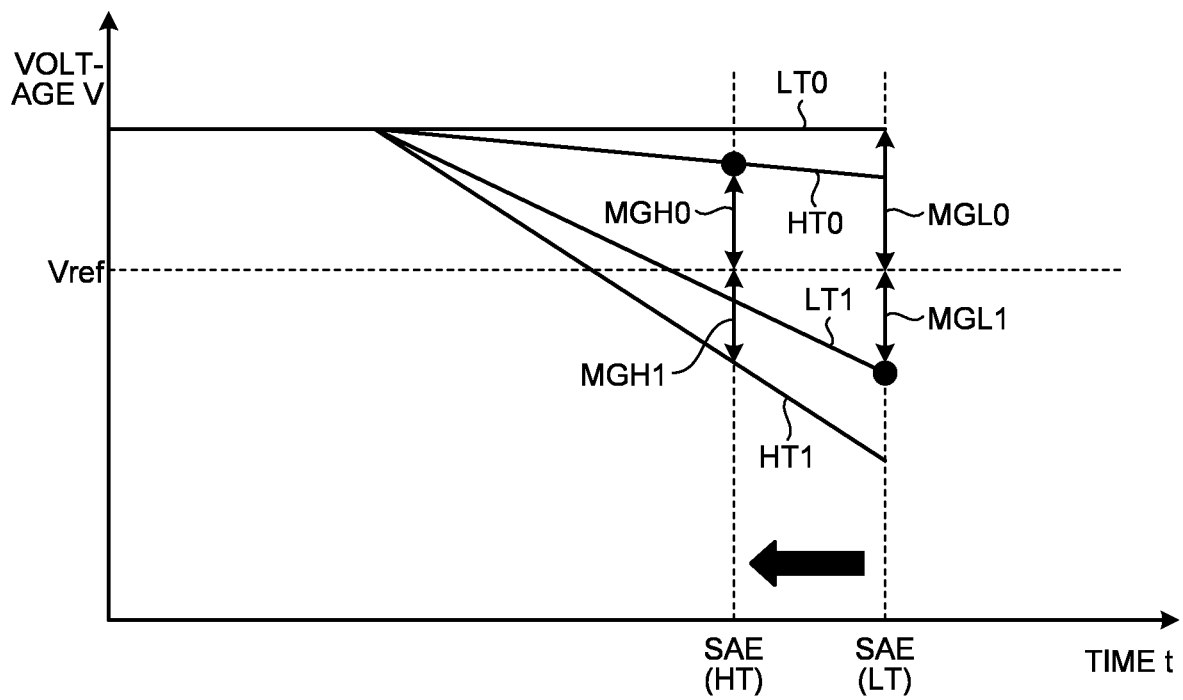
FIG. 6 is an operation explanatory diagram of an embodiment.

FIG. 6 is an operation explanatory diagram of an embodiment.

In this case, in whichever case of a case where the three series-connected first delay circuits DL1 on the upper row are selected, or a case where the three series-connected second delay circuits DL2 on the lower row are selected, a temperature coefficient is negative. Thus, as illustrated in FIG. 6, a timing at which the sense amplifier enable signal SAE output from the sense timing generation circuit 152 becomes an enable state varies between a case where a temperature is a predetermined high temperature and a case where a temperature is a predetermined low temperature.

For example, in a case where a temperature is a high temperature, the timing becomes a timing indicated by a sense amplifier enable signal SAE (HT), and in a case where a temperature is a low temperature, the timing becomes a timing indicated by a sense amplifier enable signal SAE (LT).

Accordingly, in a case where a value stored in a memory cell=0 is read out, as indicated by a signal waveform HTO in FIG. 6, even in a case where temperature is high, and a reduction in readout voltage that is caused by current flowing between a drain and a source of a transistor included in a readout target memory cell is large, at the sense amplifier enable signal SAE (HT) timing at which the sense amplifier enable signal SAE becomes the enable state, a sufficiently-large data readout margin MGH from the reference voltage Vref can be ensured, and read data does not become an error.

In addition, in a case where a value stored in the memory cell MC=1 is read out, as indicated by a signal waveform LTI in FIG. 6, even if temperature is low, and a reduction in readout voltage that is caused by current flowing between a drain and a source of the memory cell transistor TR included in the readout target memory cell MC becomes smaller, as illustrated in FIG. 6, a sufficiently-large data readout margin MGL from the reference voltage Vref can be ensured, and read data does not become an error.

Nevertheless, in a case where a negative temperature characteristics becomes too large, in a case where a value stored in the memory cell=1 at the time of high temperature is read out, a data readout margin MGH1 might decrease and read data might become an error.

Thus, in the present embodiment, by appropriately setting the selector SEL, a delay circuit having an appropriate temperature characteristics is selected in such a manner that the data readout margin MGH1 does not fall below a data readout margin MGL1.

In other words, by setting the selector SEL in such a manner that a temperature characteristics obtained in a case where a value stored in the memory cell MC=1 is read out, and a temperature characteristics of a delay circuit become identical, it is possible to prevent the data readout margin MGH1 from falling below the data readout margin MGL1.

As described above, according to the present embodiment, in a case where temperature gets higher in accordance with ambient temperature, a timing at which the sense amplifier enable signal SAE becomes the enable state is shifted to an earlier timing, and in a case where temperature gets lower, a timing at which the sense amplifier enable signal SAE becomes the enable state is shifted to a later timing, and a shift amount of the timing is made selectable using a selector. Thus, an actual operation of the sense timing generation circuit 152 can be made more preferable.

In the above description, the description has been given of a case where two systems of delay circuit groups are provided as a parallel connection unit, but three or more systems of delay circuit groups can be provided.

In the above description, a configuration in which a selector is provided as a connection switch unit and a system is switched to either system in a selectable manner is employed. Alternatively, a configuration in which input terminals of a plurality of systems of delay circuit groups included in a parallel connection unit are connected in common, and furthermore, output terminals are connected in common, and a fuse on a signal transmission circuit of the other delay circuit group is cut off or the other delay circuit group is physically separated by laser in such a manner that only a delay circuit group of either system maintains a connected state can also be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sense timing generation circuit that outputs, from an output terminal, a sense amplifier enable signal for bringing a sense amplifier into an enable state, based on a clock signal input from an input terminal, the sense timing generation circuit comprising:
   a delay circuit unit that includes a first type of delay circuits each introducing a first delay amount that decreases in accordance with a temperature rise, and a second type of delay circuits each introducing a second delay amount that decreases in accordance with a temperature rise and delays the clock signal and outputs the clock signal as the sense amplifier enable signal, wherein in response to a same amount of increase in the temperature, an amount of decrease in the first delay amount introduced by the first type of delay circuits is smaller than an amount of decrease in the second delay amount introduced by the second type of delay circuits; and
   a connection switch unit that switches a connection state of the first and second types of delay circuits in the delay circuit unit from the input terminal to the output terminal.

2. The sense timing generation circuit according to claim 1,
   wherein the first and second types of delay circuits each include a plurality of series-connected inverters including an inverter having a positive temperature characteristic and an inverter having a negative temperature characteristic, in combination, and
   wherein the connection switch unit switches the connection state in such a manner that a delay amount introduced by the delay circuit unit becomes a predetermined delay amount at a predetermined temperature.

3. The sense timing generation circuit according to claim 1,
   wherein the delay circuit unit includes a series connection unit in which the first and second types of delay circuits are connected in series, and a parallel connection unit that is connected to the series connection unit, and in which the first types of delay circuits and the second types of delay circuits are connected in parallel, and
   wherein the connection switch unit connects the series connection unit and the parallel connection unit in a state in which either the first types of delay circuits in the parallel connection unit or the second types of delay circuits in the parallel connection unit is selected.

4. The sense timing generation circuit according to claim 3,
   wherein the connection switch unit is provided between the series connection unit and the parallel connection unit or posterior to the parallel connection unit.

5. A sense timing generation circuit that outputs, from an output terminal, a sense amplifier enable signal for bringing a sense amplifier into an enable state, based on a clock signal input from an input terminal, the sense timing generation circuit comprising:
   a delay circuit unit that has a temperature characteristic by which a delay amount introduced thereby decreases in accordance with a temperature rise, includes a plurality of types of a plurality of delay circuits having different temperature characteristics, and delays the clock signal and outputs the clock signal as the sense amplifier enable signal; and
   a connection switch unit that switches a connection state of a plurality of delay circuits in the delay circuit unit from the input terminal to the output terminal,
   wherein the connection switch unit switches a connection state of a plurality of delay circuits in the delay circuit unit in such a manner that a data readout margin obtainable at a time of high temperature in a case where a value stored in a memory cell=1 is read out does not fall below a data readout margin obtainable at a time of low temperature.

6. A semiconductor memory device comprising:
   a memory cell that stores data;
   a bit line that transmits a signal read out from the memory cell;
   a sense amplifier that detects data stored in the memory cell, based on a signal transmitted via the bit line; and
   a sense timing generation circuit that controls a timing at which a sense amplifier enable signal for bringing the sense amplifier into an enable state is output from an output terminal, based on a clock signal input from an input terminal,
   wherein the sense timing generation circuit includes a delay circuit unit including a first type of delay circuits each introducing a first delay amount that decreases in accordance with a temperature rise, and a second type of delay circuits each introducing a second delay amount that decreases in accordance with a temperature rise and delays the clock signal and outputs the clock signal as the sense amplifier enable signal, wherein in response to a same amount of increase in the temperature, an amount of decrease in the first delay amount introduced by the first type of delay circuits is smaller than an amount of decrease in the second delay amount introduced by the second type of delay circuits, and a connection switch unit that switches a connection state of the first and second types of delay circuits in the delay circuit unit from the input terminal to the output terminal.

7. The semiconductor memory device according to claim 6,
   wherein the first and second types of delay circuits each include a plurality of series-connected inverters including an inverter having a positive temperature characteristic and an inverter having a negative temperature characteristic, in combination, and
   wherein the connection switch unit switches the connection state in such a manner that a delay amount introduced by the delay circuit unit becomes a predetermined delay amount at a predetermined temperature.

8. The semiconductor memory device according to claim 6,
   wherein the delay circuit unit includes a series connection unit in which the first and second types of delay circuits are connected in series, and a parallel connection unit that is connected to the series connection unit, and in which the first types of delay circuits and the second types of delay circuits are connected in parallel, and
   wherein the connection switch unit connects the series connection unit and the parallel connection unit in a state in which either the first types of delay circuits in the parallel connection unit or the second types of delay circuits in the parallel connection unit is selected.

9. The semiconductor memory device according to claim 8,
   wherein the connection switch unit is provided between the series connection unit and the parallel connection unit or posterior to the parallel connection unit.

* * * * *